United States Patent [19]
Lin et al.

[11] Patent Number: 6,080,638
[45] Date of Patent: Jun. 27, 2000

[54] FORMATION OF THIN SPACER AT CORNER OF SHALLOW TRENCH ISOLATION (STI)

[75] Inventors: Chung-Te Lin, Tainan; Shwangming Jeng, Hsin-Chu; Yuan-Horng Chiu, Taipei; Kong-Beng Thei, Hsin-Chu, all of Taiwan

[73] Assignee: Taiwan Semiconductor Manufacturing Company, Ltd., Hsin-Chu, Taiwan

[21] Appl. No.: 09/244,880

[22] Filed: Feb. 5, 1999

[51] Int. Cl.[7] .................................................. H01L 21/76
[52] U.S. Cl. ........................ 438/425; 438/436; 438/437
[58] Field of Search ................................... 438/424, 425, 438/435, 436, 437

[56] References Cited

U.S. PATENT DOCUMENTS

| | | | |
|---|---|---|---|
| 4,419,813 | 12/1983 | Iwai | 29/576 W |
| 5,099,304 | 3/1992 | Takemura et al. | . |
| 5,118,641 | 6/1992 | Roberts | 437/69 |
| 5,134,089 | 7/1992 | Barden et al. | 437/70 |
| 5,244,827 | 9/1993 | Dixit et al. | . |
| 5,410,176 | 4/1995 | Liou et al. | 257/50 |
| 5,512,163 | 4/1996 | Warfield | 205/109 |
| 5,554,560 | 9/1996 | Hsue et al. | 437/69 |
| 5,731,241 | 3/1998 | Jana et al. | 438/424 |
| 5,801,082 | 9/1998 | Tseng | 438/424 |
| 5,895,254 | 4/1999 | Huang et al. | 438/424 |

*Primary Examiner*—Wael Fahmy
*Assistant Examiner*—Long Pham
*Attorney, Agent, or Firm*—George O. Saile; Stephen B. Ackerman

[57] ABSTRACT

A method to reduce to reduce DRAM capacitor STI junction leakage current. A Shallow Trench Isolation opening is formed, within this opening Field Oxide is deposited. The top surface of the FOX is etched down and a second layer of oxide is deposited over the FOX and the adjacent active regions. This second layer of oxide is etched bringing the top surface down to below the level of the top surface of the surrounding active areas but leaving spacers where the top surface of the FOX intersects with the active areas.

31 Claims, 2 Drawing Sheets

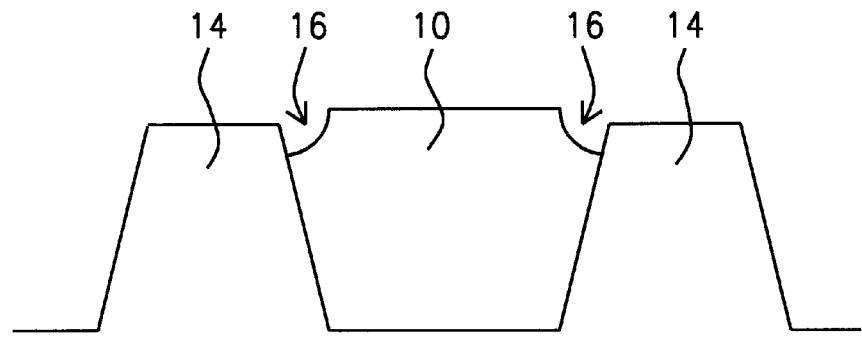
FIG. 1 - Prior Art
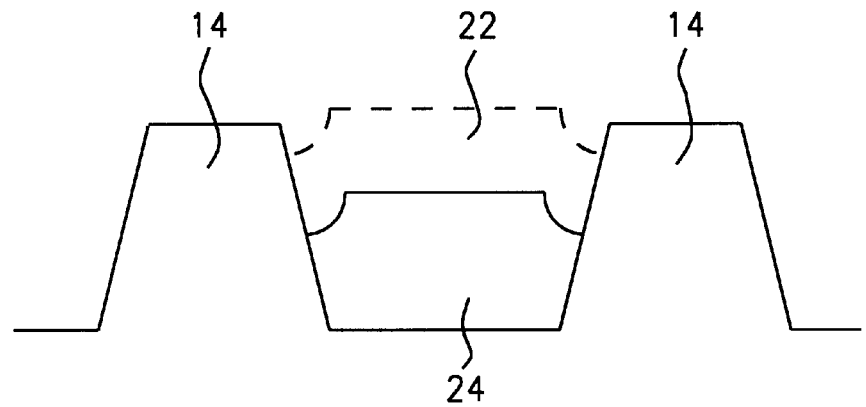
FIG. 2
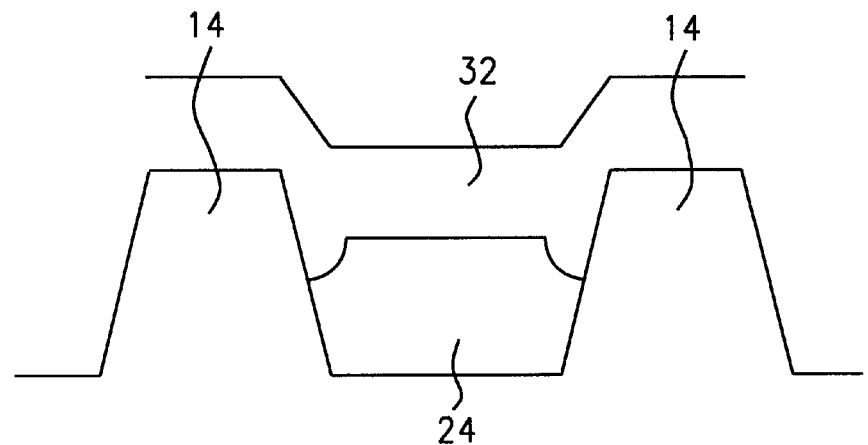
FIG. 3

FORMATION OF THIN SPACER AT CORNER OF SHALLOW TRENCH ISOLATION (STI)

BACKGROUND OF THE INVENTION (1) Field of the Invention

The invention relates to the field of semiconductor manufacturing, and more particularly to a novel method of forming an isolation area on a semiconductor device.

(2) Description of the Prior Art

For MOS circuits, threshold voltage for the field-oxide areas must be higher to isolate individual devices. Many isolation methods have been proposed such as Localized Oxidation Isolation (LOCOS), polybuffered LOCOS (PBLOCOS) and Shallow Trench Isolation (STI). The present invention relates to the process of shallow trench isolation. In shallow trench isolation, trenches about 0.3 to 0.8 um. deep are anisotropically etched into the silicon substrate through dry etching. Active regions are those that are protected from the etch when the trenches are created. Next, a CVD oxide is deposited on the wafer surface and then etched back so that it remains only in recesses, with its top surface at the same level as the original silicon surface. Etchback is performed using a sacrificial photoresist method. This technique has the advantage of having no birdbeak (a problem experienced with the LOCOS technology) and no encroachment. Also, when two devices are separated by a trench, the electrical field lines have to travel a longer distance and change direction twice, so they are considerably weakened. Therefore, trenches in submicrometer dimensions are adequate for isolation to prevent punch-through and latch-up phenomena. Shallow-trench techniques however are complicated while in the past LOCOS and Poly-Bufferred LOCOS (PBLOCOS) have provided satisfactory results. Shallow-trench techniques are therefore only slowly being used extensively in the industry.

The oxide lost at the shoulders of a shallow trench can induce junction leakage and Kirk's effect of the devices. This latter effect can be explained as follows. As the collector-current density in an npn transistor increases, the density of electrons transported across the C-B junction also increases. When this density of electrons crossing the C-B junction becomes comparable to the doping on the collector side of the space-charge region, the total charge in this region becomes significantly reduced from that under low-level injection conditions, leading to a lower electric-field gradient in the C-B junction. Since the collector voltage is constant, the integration of the electric field will remain the same, with or without current. However, with a lower maximum electric-field strength, the space-charge region edge in the base moves toward the collector, effectively increasing the base width. This phenomenon is referred to as the base push-out effect or the Kirk effect.

The oxide loss of STI is due to wet etching processes. For wet etching, lateral etching cannot be avoided. If, on the other hand, the loss of oxide can be increased, this excess oxide can be used to form a space layer at the shoulders of the trench that functions as a protection layer. This wider space layer results in a reduction of junction leakage current.

Referring now specifically to FIG. 1, there is shown a Prior Art cross section of the Shallow trench isolation region 10. In shallow trench isolation, trenches 10 are anisotropically etched into the silicon substrate through dry etching. The trench 10 typically has a depth within the range of about 3000 to 4000 Angstrom. Active regions 14 are those that are protected from the etch when the trenches are created. Next, a CVD oxide is deposited on the wafer surface and then etched back so that it remains only in recesses, with its top surface at the same level as the original silicon surface. Etchback is performed using a sacrificial photoresist method.

The cross section of FIG. 1 shows the typical formation of a STI region 10, including the phenomenon of the loss of the shoulders 16 of the STI. This loss of the shoulders 16 results in previously highlighted negative effects in the formation of the STI, further processing steps within the scope of the present invention will prevent the formation of the shoulders 16. The STI region 10 is filled using Field Oxide (FOX).

In the salicidation process, to which the invention also applies, the entire source and drain regions and the top of the poly-silicon gate of a MOSFET are covered with a low resistivity metallic thin film. This is attractive because such a film is formed using a self-aligned process that does not require any additional masking steps.

U.S. Pat. No. 5,134,089 (Barden et al.) shows a process of (1) form Field oxide 14 (2) etch Field oxide, see FIG. 4 (3) grow thermally a second oxide layer over the field oxide, see FIG. 5, col. 3, lines 54–64 (4) dry etch second oxide to form spacer, see FIG. 6. Barden appears to show the same steps as the invention but differs in that Barden grows a FOX (not STI) and grows a 2nd oxide layer (invention uses HDPCVD Oxide).

U.S. Pat. No. 5,731,241 (Jang et al.) teaches a FOX with a self aligned oxide sacrificial layer. However, Jang's sacrificial layer is above the surface and does not form spacers.

U.S. Pat. No. 5,554,540 (Hsue et al.) shows a method for forming a sacrificial layer over a FOX and etching back the sacrificial layer.

U.S. Pat. No. 5,118,641 (Roberts) shows a SiN spacer on a FOX. U.S. Pat. No. 5,410,176 (Liou et al.) teaches a method for forming a $SiO_2$ spacer with STI. U.S. Pat. No. 5,801,082 (Tseng) shows a STI method using a SIN and SOG overlayers.

SUMMARY OF THE INVENTION

It is the primary objective of the invention to reduce STI junction leakage current.

It is another objective of the invention to reduce the STI Kirk effect.

It is yet another objective of the present invention to eliminate the effects of lateral oxide etching when applying wet etch for the formation of STI.

It is yet another objective of the present invention to increase the operational margin for the STI process.

A Shallow Trench Isolation opening is formed, within this opening Field Oxide is deposited. The top surface of the FOX is etched down and a second layer of oxide is deposited over the FOX and the adjacent active regions. This second layer of oxide is etched bringing the oxide top surface down to below the level of the top surface of the surrounding active areas but leaving spacers where the top surface of the FOX intersects with the active areas.

BRIEF DESCRIPTION OF THE DRAWINGS

FIG. 1 shows the Prior Art formation of the STI.

FIG. 2 shows the etch to remove a more Field Oxide.

FIG. 3 shows the deposition of a second oxide layer.

DESCRIPTION OF THE PREFERRED EMBODIMENT

Figure 4:
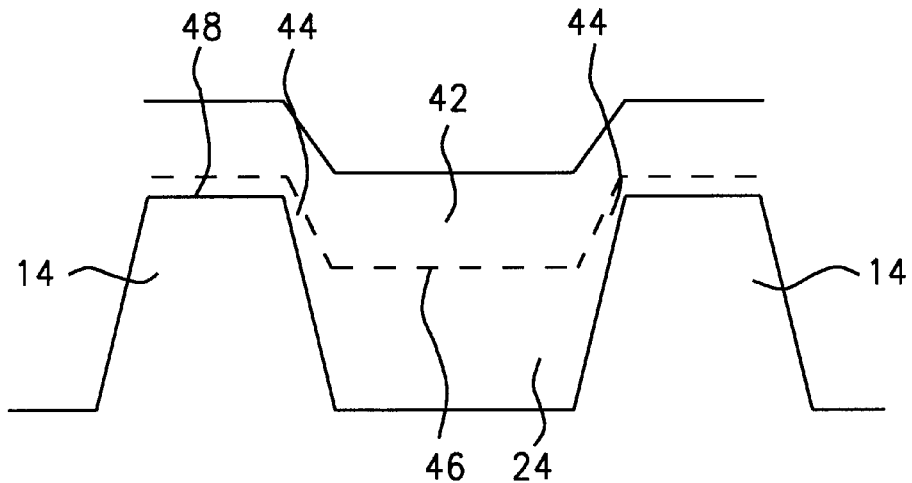
FIG. 4 shows after the application of a dry etch.

FIG. 2 shows a cross section of the STI after a dry or wet etch has been applied to the surface of the layer 10 of the field oxide (FIG. 1). The objective of this etch is to remove a portion 22 from the surface of the STI oxide, a layer 22 within the range of approximately 600 to 1000 Angstrom is removed from the deposited layer of FOX which leaves a layer 24. It must be remembered from FIG. 1 that the depth of the STI trench is within the range of between 3000 and 4000 Angstrom, a typical height for the FOX layer 24 in FIG. 2 is within the range between about 3300 and 4300 Angstrom. The areas 14 that surround the STI trench, FIG. 2, are typically about 0.22 wide at the top and 0.25 um wide at the bottom. It must be noted that the shoulders are missing in this cross section, the profile of the top surface is the same as the profile of the FOX layer 10 in FIG. 1. The removal of the top layer of the field oxide is required as a preparatory step in the creation of the spacers (to be highlighted in subsequent figures) within the STI area.

FIG. 3 shows a cross section after a layer 32 of Resistor Protection Oxide (RPO) has been deposited over the surface of layer 24 and the active regions 14. This layer is deposited using High Density Plasma CVD (HDPCVD) technology, this technology is used to obtain a better oxide layer 32 and, in addition, to limit the processing expense by limiting the thermal budget for the deposition process.

FIG. 4 shows the results of the application of a dry etch to the surface of the layer of HDPCVD oxide. Layer 42 is removed leaving spacers 44 in place. It is clear that the previously experienced lack of shoulders (areas 16, FIG. 1) has been eliminated and that, instead, the spacers 44 are formed at the top of the FOX layer 24. The top surface 46 of the field oxide covers, at this time, the top surface 48 of the active regions 14. This layer of oxide is removed from the surface 48 of the active areas 14 by a subsequent etching back using RIE.

Figure 5:
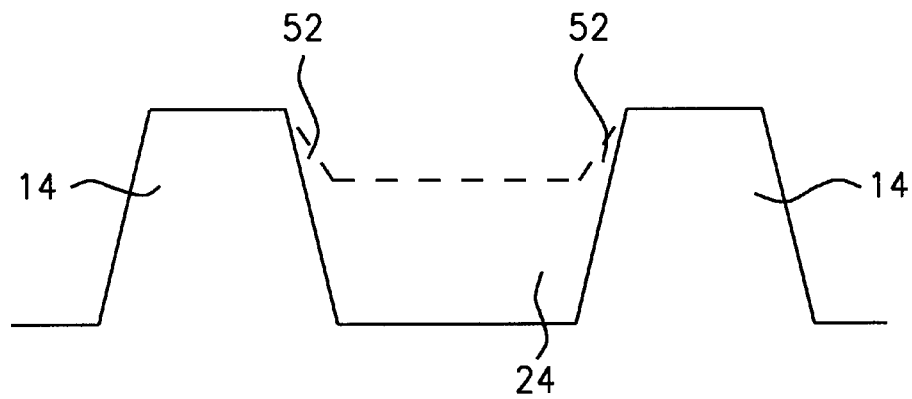
FIG. 5 shows a cross section of a completed STI.

FIG. 5 shows a cross section of the completed STI. It is apparent that, where previously oxide loss was exhibited at the shoulders of the STI (16, FIG. 1), spacers 44 have now been created.

It will be apparent to those skilled in the art, that other embodiments, improvements, details and uses can be made consistent with the letter and spirit of the present invention and within the scope of the present invention, which is limited only by the following claims, construed in accordance with the patent law, including the doctrine of equivalents.

What is claimed is:

1. A method of fabricating shallow trench isolation areas on a silicon substrate having device areas therein, comprising the steps of:
   providing a silicon substrate having a principle surface that is planar;
   forming Field Oxide isolation areas on said silicon substrate whereby said formation of Field Oxide Isolation areas comprises a first etch of a deposited Field Oxide layer;
   applying a second etch to said Field Oxide layer;
   depositing a second oxide layer over the surface of said substrate thereby including said Field Oxide layer; and
   etching said second oxide layer.

2. The method of claim 1 wherein said forming Field Oxide isolation areas comprises:
   creating a plurality of active regions within the surface of said substrate;
   etching a shallow trench isolation structure formed into a recess at said surface between a pair of said plurality of active regions;
   depositing a first oxide layer within said isolation structure; and
   applying a first etch to said first oxide layer.

3. The method of claim 2 wherein etching a shallow trench isolation structure is an anisotropical etch into the silicon substrate through dry etching.

4. The method of claim 2 wherein said active regions are those that are protected from the etch when said shallow trenches are created.

5. The method of claim 2 wherein said depositing a first oxide layer is depositing a CVD oxide over said surface of a semiconductor.

6. The method of claim 2 wherein said applying first etch to said first oxide layer is applying an etched back so that first oxide remains only in recesses, with its top surface at the same level as the original silicon surface.

7. The method of claim 1 wherein said applying second etch to said Field Oxide layer is removing a layer of within the range of approximately 600 to 1000 Angstrom from said first oxide layer.

8. The method of claim 1 wherein said depositing a second oxide layer is depositing a layer that contains oxide whereby said layer has a thickness within the range of approximately 1000 to 1500 Angstrom.

9. The method of claim 1 wherein said depositing a second oxide layer is depositing a layer that contains Silicon nitride and/or oxide whereby said layer has a thickness within the range of approximately 1000 to 1500 Angstrom.

10. The method of claim 1 wherein said etching said second oxide layer is applying a dry etch.

11. The method of claim 1 wherein said trench has a depth in the range of between 3000 and 5000 Angstrom.

12. The method of forming a semiconductor circuit on a silicon substrate, comprising:
   securing a semiconductor wafer; creating a plurality of active regions on said silicon substrate;
   etching a shallow trench isolation structure formed into a recess at said surface between a pair of said plurality of active regions;
   depositing a first CVD oxide layer within said isolation structure;
   applying a first etch to said first CVD oxide layer;
   applying a second etch to said first CVD oxide layer;
   depositing a second oxide layer over the surface of said substrate; and
   etching said second oxide layer.

13. The method of claim 12 wherein etching a shallow trench isolation structure is an anisotropical etch into the silicon substrate through dry etching.

14. The method of claim 12 wherein said active regions are those that are protected from the etch when said shallow trenches are created.

15. The method of claim 12 wherein said depositing a first oxide layer is depositing a CVD oxide on the top surface of said semiconductor substrate.

16. The method of claim 12 wherein said applying first etch to said first oxide layer is applying an etched back so that first oxide remains only in recesses, with its top surface at the same level as the original silicon surface.

17. The method of claim 16 wherein said etchback is a sacrificial photoresist etchback.

18. The method of claim 12 wherein said applying second etch to said first oxide layer is removing a layer within the range of approximately 600 to 1000 Angstrom from said first oxide layer.

19. The method of claim 12 wherein said depositing a second oxide layer is depositing a layer that contains oxide whereby said layer has a thickness within the range of approximately 1000 to 1500 Angstrom.

20. The method of claim 12 wherein said depositing a second oxide layer is depositing a layer that contains SiN and/or oxide whereby said layer has a thickness within the range of approximately 1000 to 1500 Angstrom.

21. The method of claim 12 wherein said depositing a second oxide layer is depositing a layer of High Density Plasma CVD.

22. The method of claim 12 wherein said etching said second oxide layer is applying a dry etch.

23. A method of fabricating shallow trench isolation areas on a silicon substrate having device areas therein, comprising the steps of:

provoiding a silicon substrate having a surface that is planar;

thermally oxidizing said silicon substrate surface thereby forming a silicon oxide pad layer;

depositing a first insulating layer on said silicon oxide pad layer thereby forming a barrier layer to oxidation;

patterning said first insulating layer and said silicon oxide pad layer by masking and anisotropic etching thereby creating a trench thereby furthermore leaving portions of said first insulating layer and pad oxide pad layer over said device areas and exposing said substrate surface;

removing said masking;

filling said trench with a field oxide;

blanket etching back said field oxide to the surface of said first insulating layer;

etching said field oxide thereby further decreasing the surface of said field oxide within said trench;

depositing a second layer of oxide over the surface of said field oxide and the surface of said insulating layer; and etching said second layer of oxide down to the surface of said first insulating layer.

24. The method of claim 23 wherein said pad oxide layer is composed of an oxide formed by a process selected from the group consisting of PLTEOS, TEOS and $N_2$ treated thermal oxide.

25. The method of claim 23 wherein said silicon pad oxide layer is thermally grown to a thickness within the range of between 200 and 300 Angstrom.

26. The method of claim 23 wherein said insulating layer contains a silicon nitride having a thickness of between 1500 and 3000 Angstrom.

27. The method of claim 23 whereby said trenches are etched to a depth of between 3000 and 6000 Angstrom in said substrate.

28. The method of claim 23 whereby said etching said field oxide is removing between 600 and 1000 Angstrom from the top surface of said field oxide.

29. The method of claim 23 whereby said depositing a second layer of oxide is depositing a layer of between 1000 and 15000 Angstrom said layer containing oxide and/or SiN with oxide.

30. The method of claim 23 whereby said depositing a second layer of oxide is a high density plasma CVD (HDPCVD).

31. The method of claim 23 whereby said etching said second layer of oxide is a dry etch.

* * * * *